United States Patent
Young et al.

[11] Patent Number: 5,819,737
[45] Date of Patent: Oct. 13, 1998

[54] MAGNETIC RESONANCE METHODS AND APPARATUS

[75] Inventors: Ian Robert Young, Marlborough; Michael Burl, Twickenham, both of Great Britain

[73] Assignee: Picker International, Inc., Highland Hts., Ohio

[21] Appl. No.: 727,971

[22] Filed: Oct. 9, 1996

[30] Foreign Application Priority Data

Oct. 13, 1995 [GB] United Kingdom .................. 9521009

[51] Int. Cl.⁶ .................................................. A61B 5/055
[52] U.S. Cl. .................................. 128/653.2; 128/653.5; 324/318; 324/309
[58] Field of Search ............................ 128/653.2, 653.5, 128/656, 899; 324/318, 322, 313, 309

[56] References Cited

U.S. PATENT DOCUMENTS

| | | |
|---|---|---|
| 4,572,198 | 2/1986 | Codrington . |
| 5,035,231 | 7/1991 | Kubokawa et al. . |
| 5,271,400 | 12/1993 | Dumoulin et al. . |
| 5,318,025 | 6/1994 | Dumoulin et al. . |
| 5,644,234 | 7/1997 | Rasche .................................... 324/318 |

FOREIGN PATENT DOCUMENTS

| | | |
|---|---|---|
| 0165742 | 12/1985 | European Pat. Off. . |
| 0673621 | 9/1995 | European Pat. Off. . |
| 2259986 | 3/1993 | United Kingdom . |

OTHER PUBLICATIONS

"Intravascular (Catheter) NMR Receiver Probe: Preliminary Design Analysis and Application to Canine Iliofemoral Imaging"; Magnetic Resonance in Medicine 24 (1992) Apr., No. 2, Duluth, MN, US; pp. 343–357.

Examiner's Report to the Comptroller under Section 17; Application No. GB 9521009.2; Date of completion of Search: 10 Jan. 1996; Examiner: Mr. K. Sylvan.

*Primary Examiner*—Brian L. Casler
*Assistant Examiner*—Eleni Mantis Mercader
*Attorney, Agent, or Firm*—T. B. Gurin; J. J. Fry

[57] ABSTRACT

A flexible catheter or other object for insertion into an object is designed for use in connection with magnetic resonance (MR) imaging techniques. The catheter carries a closed loop coil arrangement tuned to the RF excitation frequency used in operation of an MR imager. The coil arrangement includes turns which lie substantially in non-parallel planes when the axis of the catheter is in a straight line. The coil arrangement may include two coils which are constituted by different sections of an electrically conductive track carried on a flexible, insulating substrate. According to another embodiment, the coil arrangement may comprise two separate closed loop tuned coils each constituted by a narrow metallized track carried on a flexible, insulating substrate. In another embodiment, the coil comprises turns of a saddle form.

18 Claims, 4 Drawing Sheets

MAGNETIC RESONANCE METHODS AND APPARATUS

This invention relates to magnetic resonance methods and apparatus.

More particularly the invention relates to magnetic resonance methods and apparatus for the examination of an internal region of a body, for example, an internal region of the body of a live human patient for medical purposes.

In use of magnetic methods and apparatus for examining the body of a live human patient for medical purposes, e.g. to obtain image and/or spectroscopic data, the body under investigation is placed in a homogeneous static magnetic field to define an equilibrium axis of magnetic alignment in the region of the body being examined. A radio frequency (r.f.) magnetic field is then applied to the region being examined in a direction orthogonal to the static magnetic field direction to excite magnetic resonance in material, typically in hydrogen protons, in the region, and the resulting r.f. signals are detected and analysed. During this sequence of operations one or more gradients are normally imposed on the static magnetic field to cause excitation of magnetic resonance preferentially in the region of the body to be examined, to encode spatially the detected r.f. signals, and also for other purposes such as flow encoding.

It is sometimes required to indicate in an image obtained the location of an object previously placed in the body. In the case of a human patient the object may, for example, be a catheter or a surgical tool for carrying out an operation on the patient.

In order to enable the position of the object within the body to be located it has been proposed to attach a coil to the object which can be supplied with electric current from a source 3 outside the body so as to disturb locally the magnetic field applied for imaging and thereby produce an indication of the position of the object in the image produced by the apparatus.

Alternatively a coil attached to the object is used to apply an r.f. field to the body locally thereby to excite magnetic resonance in the body locally, adjacent the object, and the resulting spins are spatially encoded by the application of magnetic field gradients and detected.

Both these methods have the disadvantage that electrical connections from inside to outside the body are required which can be a severe disadvantage, even in the case of catheters where a cable to the catheter, is provided, since the cable is required for other purposes.

In an alternative method a planar closed loop coil arrangement tuned to the r.f. excitation frequency is attached to the object. This enhances the r.f. signals generated in the region of the coil arrangement, and hence the object, compared with those generated in other regions of the body under examination. However, this method is not found to be satisfactory where the object is of tubular flexible form so as to be adapted to move along a naturally occurring passage in a patient, e.g. a blood vessel. The orientation of the coil arrangement then changes with movement. of the object so that the coupling of the coil with the r.f. field, and hence the degree of enhancement of the r.f. signals generated, varies as the object moves.

It is an object of the present invention to provide a magnetic resonance method and apparatus whereby this problem is alleviated.

According to a first aspect of the present invention there is provided a method of locating the position of an object placed in a region of a body being examined using a magnetic resonance technique comprising: attaching to the object a closed loop tuned coil arrangement; subjecting said region to a magnetic resonance excitation and detection examination sequence at the frequency to which said coil arrangement is tuned, so as to acquire a detected signal, the sequence including at least one magnetic field gradient whereby the detected signals are spatially encoded; and utilising the detected signals to obtain an indication of the position of said coil arrangement and hence said object, in said region; the coil arrangement being carried on a tubular flexible former and incorporating turns which lie substantially in non-parallel planes when the axis of the former lies substantially in a straight line.

According to a second aspect of the present invention there is provided a magnetic resonance apparatus for the examination of an internal region of a body including means for indicating the location of an object placed in said region comprising: a closed loop tuned coil arrangement attached to the object; and means for subjecting said region to a magnetic resonance excitation and detection examination sequence at the frequency to which the coil arrangement is tuned so as to acquire a detected signal, the sequence including the application of at least one spatially encoding magnetic field gradient to said region to enable determination of the position of the coil, and hence the object, in the body from the detected signal, and the coil arrangement being carried on a tubular flexible former and incorporating turns which lie substantially in non-parallel planes when the axis of the former lies substantially in a straight line.

In methods and apparatus according to the invention the coil arrangement preferably includes at least one turn which lies substantially in a plane orthogonal to the plane of at least one other turn of the coil arrangement when the axis of the former lies substantially in a straight line. The coil arrangement suitably comprises one or more electrically conductive tracks formed on a thin flexible substrate wrapped around the object.

A magnetic resonance method and apparatus in accordance with the invention will now be described by way of example with reference to the accompanying drawings in which.

Figure 1:
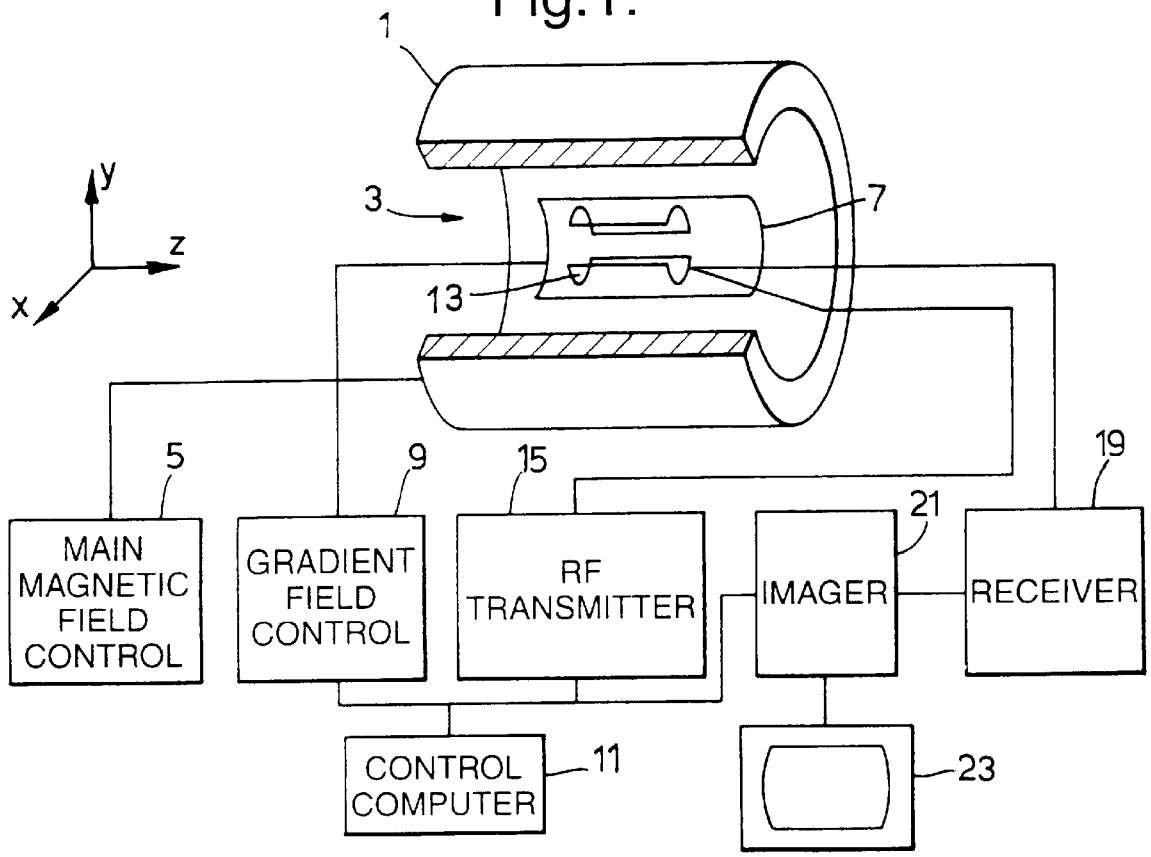
FIG. 1 is a schematic diagram of a typical magnetic resonance imaging apparatus.

Referring to FIG. 1, the apparatus, which is a magnetic resonance medical imaging apparatus, includes a tubular electromagnet 1 which produces a strong uniform static main axial magnetic field in a cylindrical volume 3 in which a patient to be imaged is placed in use of the apparatus.

The strength of the field in the volume 3, and hence in the body of the patient being imaged, is controlled by a main magnet field control means 5 which controls the supply of energising current to the electromagnet energising coil (not shown).

The apparatus further includes a gradient coil arrangement 7 whereby a gradient may be imposed on the static magnetic field in the volume 3 in any one or more of three orthogonal directions. The coil arrangement 7 is energised by a gradient field control means 9 under control of a computer 11.

The apparatus further includes an r.f. coil system 13 which includes a transmitting coil arrangement which in operation of the apparatus is energised by an r.f. transmitter 15 under control of the computer 11 to apply an r.f. field to the body being imaged.

The r.f. coil system 13 also includes an r.f. receiving coil arrangement arranged to detect r.f. signals resulting from magnetic resonance excited in the body of the patient being imaged. The detected signals are passed via a receiver 19 to an imager 21 which under control of the computer 11 processes the signals to produce signals representing an image of the patient's body. These signal are, in turn, passed to a display device 23 to provide a visual display of the image.

In operation of the apparatus the strong magnetic field provided by the electromagnet 1 defines an equilibrium axis of magnetic alignment in the body being imaged.

To obtain an image of a selected region, e.g. a cross-sectional slice of the body, an r.f. field pulse is first applied to the body by means of the coil system 13 to excite magnetic resonance in the selected region. To this end the coil system 13 produces a field in a direction orthogonal to the static field direction so as to tip the spins of nuclei in the selected region from the direction of the static field into a plane orthogonal to the static field direction i.e. into the x—y plane with x, y and z directions as depicted in FIG. 1. To restrict excitation to the selected region the r.f. field pulse is applied in conjunction with magnetic field gradients imposed by the coil arrangement 7, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the r.f. coil system 13, and processed to produce an image.

Normally a number of excitation and signal detection sequences are required to collect sufficient data to produce a satisfactory image.

Figure 2:
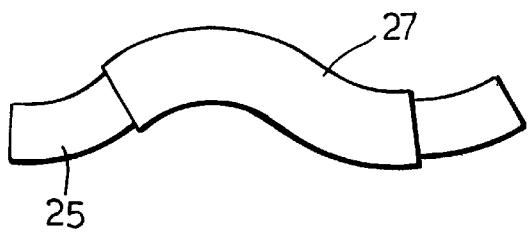
FIG. 2 is a diagram of a catheter or like object.

Referring to FIG. 2 when it is desired to insert an object 25, e.g. a catheter or a surgical instrument, into a patient via a naturally occurring passage in the patient's body, e.g. a blood vessel, the object 25 is fabricated in tubular flexible form so as to be capable of being maneuvered around any bends and twists which may occur along the length of the passage.

In order to allow tracking of movement of the object 25 by use of the magnetic resonance imaging apparatus, the object 25 carries a closed loop coil arrangement 27 tuned to the r.f. excitation frequency used in operation of the apparatus.

To locate the position of the object 25 in the patient's body an excitation and detection sequence of known form is used. The location excitation and detection sequence also includes spatially encoding magnetic field gradients in appropriate directions, e.g. in x, y and z directions.

The detected signals produced by the location excitation and detection sequence include an enhanced component, i.e. a component which is larger than components due to the material of the body which are present in the detected signals, whose frequency indicates the location of the object 25 in the body.

In accordance with the invention, in order to avoid loss of signal from the coil arrangement 27 as the object 25, and hence the coil arrangement 27, changes orientation, as the object 25 travels through the patient's body, the coil arrangement 27 includes turns which lie substantially in non-parallel planes when the axis of the object lies in a straight line. To this end the coil arrangement 27 is suitably in the form of a flexible printed circuit wrapped around the object 25.

Figure 3A:
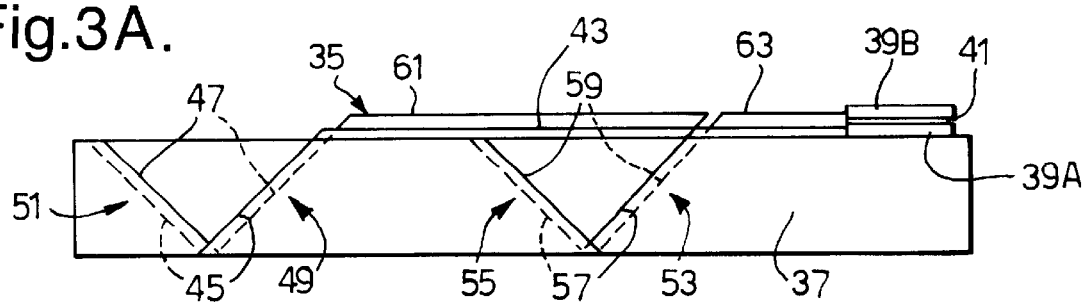
FIGS. 3A, 3B and 4 illustrate details of a coil arrangement attached to the object of FIG. 2.
Figure 3B:
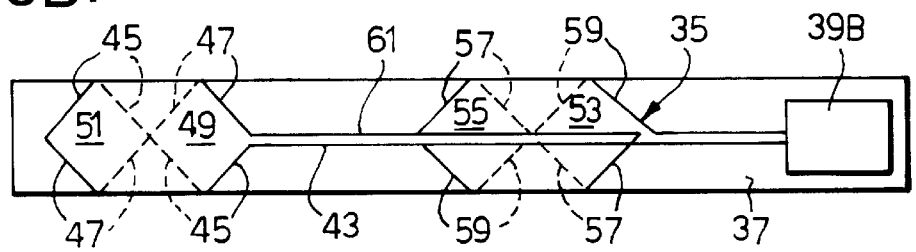
Figure 4:
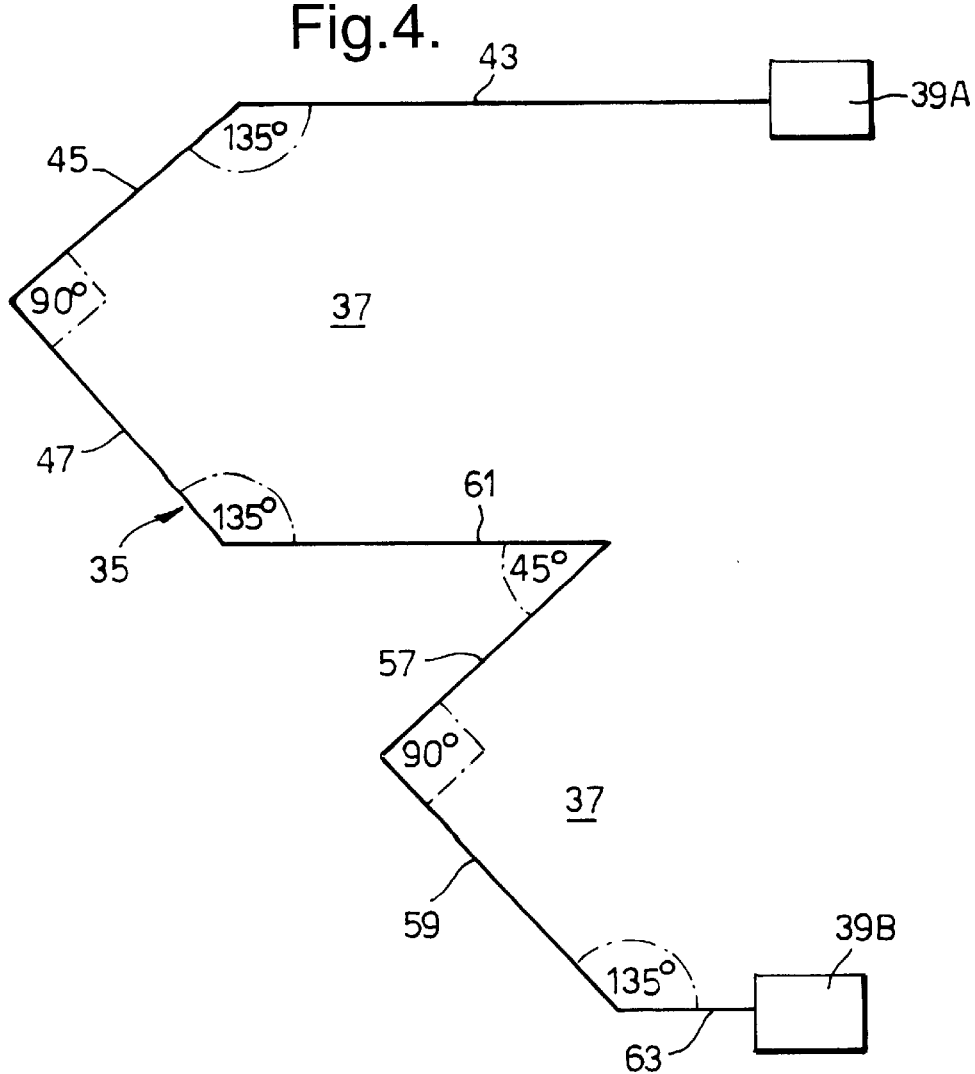
Figure 6:
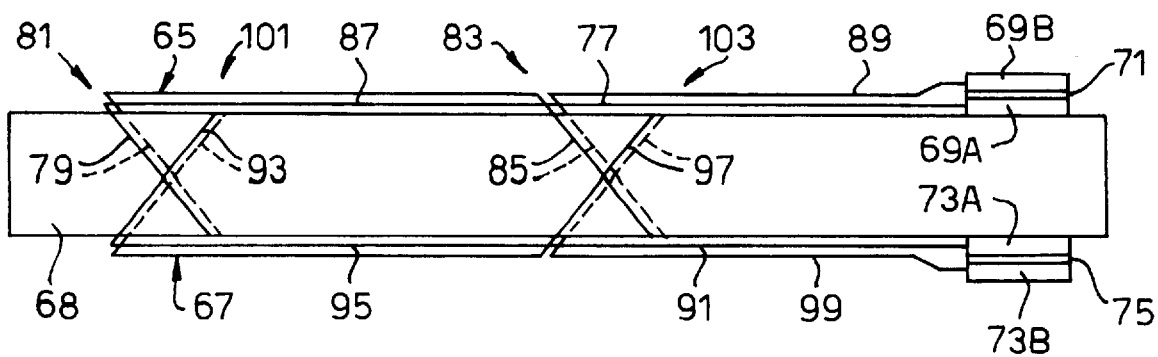

Referring to FIGS. 3A, 3B and 4, in one particular embodiment the coil arrangement 27 comprises two coils which are constituted by different sections of an electrically conductive track 35 carried on one side of a thin flexible substrate 37 of electrically insulating material, the track 35 suitably being formed using a printed circuit technique. FIGS. 3A and 3B show side elevations of the track 35 from orthogonal directions with the substrate 37 wrapped around the object 25 and the axis of the object 25 lying in a straight line and FIG. 6 shows the substrate 37 laid out flat. The track 35 extends between two rectangular metallised electrically conducting areas 39A and 39B on the substrate 37 which, when the substrate 37 is wrapped around the object 25, have a layer of dielectric material 41 inserted between them to form a tuning capacitor of desired value for the coil arrangement 27.

The track 35 has, in order, starting from the rectangular area 39A, a first section 43 which, with the substrate 37 wrapped around the object 25, lies parallel to the axis of the object 25 (see FIG. 3), a second section 45 which forms a single helical turn round the object 25, and a third section 47 which forms a second helical turn round the object 25, overlying the turn formed by section 45. The sections 45 and 47 thus together effectively form two single turns 49 and 51 in orthogonal planes, as shown in FIG. 4. A second pair of orthogonal turns 53 and 55 are similarly provided by fifth and sixth sections 57 and 59 of the track 37. The fourth section 61 of the track 35, which when the substrate 37 is wrapped around the object 25 lies parallel to the axis of the object 25, serves to space the turns 49, 51 axially from the turns 53, 55. The seventh and last section 63 of the track 37 serves to connect the end of the section 59 to the rectangular area 39B.

It will be appreciated that whilst only two pairs of turns 49, 51 and 53, 55 are shown in FIGS. 3 and 4, further spaced pairs of turns may easily be provided if desired. Similarly, more than one turn may easily be provided in each orthogonal plane, if desired. Furthermore, whilst a total of four turns only are shown in FIGS. 3 and 4, for simplicity, a coil arrangement typically comprises from twenty to thirty turns to provide enough inductance for tuning purposes.

It is further pointed out that, for simplicity, sections 45, 47, 57 and 59 of track 35, are depicted as being straight when laid flat, and therefore form helical turns when substrate 37 is wrapped around the object 25, with the result that turns 49, 51, 53 and 55 are not truly planar. To overcome this, the sections 45, 47, 57, 59 may be made so as to have an appropriate sinusoidal form when laid flat.

Figure 5:
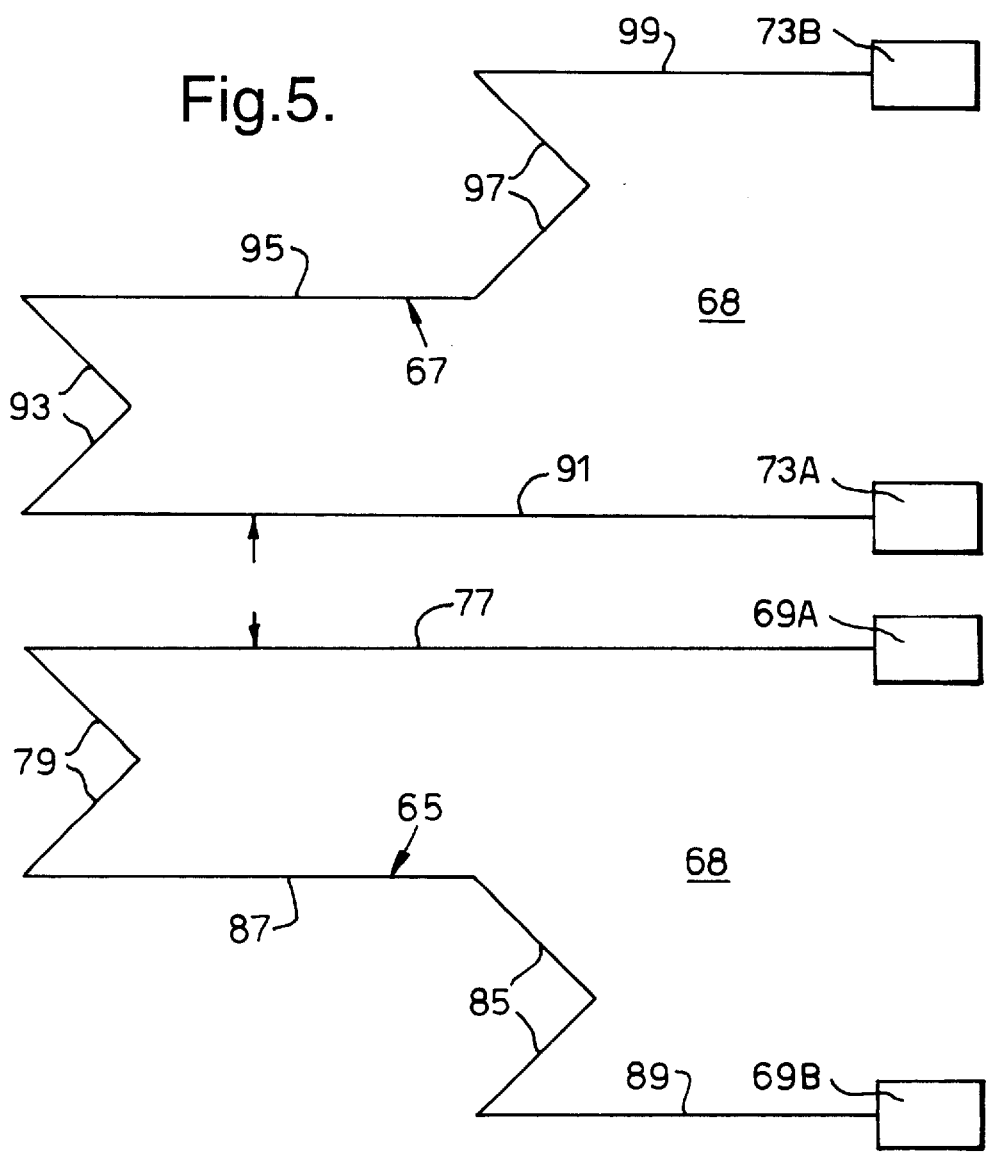
FIGS. 5 and 6 illustrate a first alternative form for the coil arrangement

Referring to FIGS. 5 and 6, in a second particular embodiment the coil arrangement 27 comprises two separate closed loop tuned coils each constituted by a separate narrow metallised electrically conductive track 65 or 67 carried on one side of a thin flexible substrate 68 of electrically insulating material (not shown).

As shown in FIG. 5 and 6 which are respectively a view of the tracks 65 and 67 with the substrate laid out 68 flat (i.e. corresponding to FIG. 4) and with the substrate 68 wrapped around the object 25 (i.e. corresponding to FIG. 3A), the track 65 extends between metallised conducting areas 69A and 69B which form with a layer of dielectric material 71 a tuning capacitor for one coil. Similarly, track 67 extends between metallised areas 73A and 73B, with a layer of dielectric material 75, a tuning capacitor for the other coil.

The track 65 has, in order starting from electrode 69A a first section 77 which, with the substrate 68 wrapped around the object 25, lies parallel to the axis of the object 25, a second section 79 which forms a single planar turn 81 round the object 25. A second single planar turn 83, parallel to the turn 81, is formed by a fourth section 85 of the track 65. The third section 87 of the track, which when the substrate 68 is wrapped around the object 25 is parallel to the axis of the object 25, serves to space the turn 83 axially from the turn 81 and the fifth and last section 89 of the track connects the end of the fourth section 85 to the electrode area 69B.

The track 67 similarly comprises five sections 91, 93, 95, 97 and 99 between electrode areas 73A to 73B. The electrode 73A and the first section 91 are spaced from electrode area 69A and first section 77 of track 65 by a distance d equal to half the circumference of object 25 (ignoring the thickness of the substrate 68) so that the electrode 73A lies diametrically opposite electrode 69A and section 91 lies diametrically opposite section 77. Section 93 consequently forms a single planar turn 101 in a plane orthogonal to the plane of turn 81 and overlying turn 81, and section 97 forms a single planar turn 103 in a plane orthogonal to the plane of turn 83 and overlying turn 83.

It will be appreciated that whilst track 65 as shown in FIGS. 5 and 6 provides only two turns 81 and 83, further turns coplanar with turn 81 and further turns coplanar to turn 83 may easily be provided. Similarly one or more turns may easily be provided in one or more further planes spaced axially along the object 25. Similarly remarks apply equally, of course, to the track 67 and the turns provided thereby. The remarks made above in relation to FIGS. 3 and 4 regarding the total number of turns and the required shape of the sections of the track 35 to provide truly planar turns apply equally, of course, to the embodiment of FIGS. 5 and 6.

Figure 7:
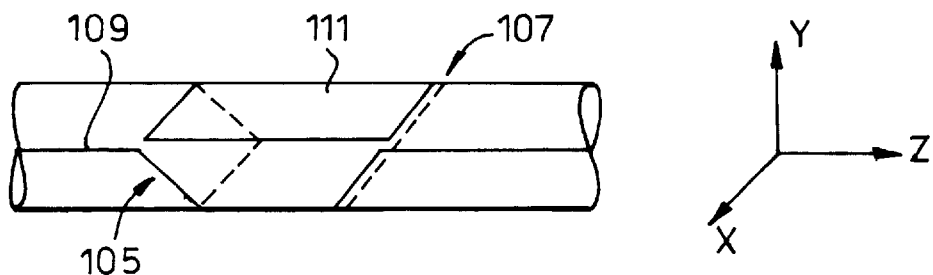
FIG. 7 illustrates a second alternative form for the coil arrangement.

Referring now to FIG. 7, in a third particular embodiment the coil arrangement 27 comprises one or more pairs of turns 105 and 107 whose axes lie respectively in ZY and ZX planes, where XY and Z are a set of mutually orthogonal axes, the Z axis of which is in the direction of the axis of the object 25 when it is straight.

As in the case of the first two described embodiments the coil arrangement 27 of FIG. 7 is suitably constituted by an electrically conductive track 109 carried on a thin flexible substrates 11 of electrically insulating material, FIG. 7 showing a side elevation of the track 109 with the substrate 111 wrapped around the object 25.

In further embodiments the coil arrangement 27 comprises turns of saddle form. In one such embodiment, illustrated in FIG. 8, a first pair of axially aligned saddle coils 113 each having one or more turns are positioned diametrically opposite one another on the object 25 alongside a second pair of axially aligned diametrically opposite saddle coils 115, whose axis is orthogonal to the axis of the coils 113. Further orthogonal pairs of saddle coils, such as coils 117 and 119, may be positioned at spaced positions along the object 25 The coils of such saddle arrangements are suitably constituted by an electrically conductive track or tracks formed on one or more thin flexible substrates of electrically insulating material wrapped around the object 25, as in the case of the previously described embodiments. In one such arrangement the tracks which respectively constitute the two coils of each diametrically opposite pair of saddle coils are carried on different ones of two flexible substrates, one such substrate 121 being shown in FIG. 9. The two substrates 121 are then wrapped around opposite halves of the object 25 to assembly the coils into diametrically opposite pairs. However, due to the requirement for cross-overs in the tracks, tracks on both sides of the substrates are required.

Figure 8:
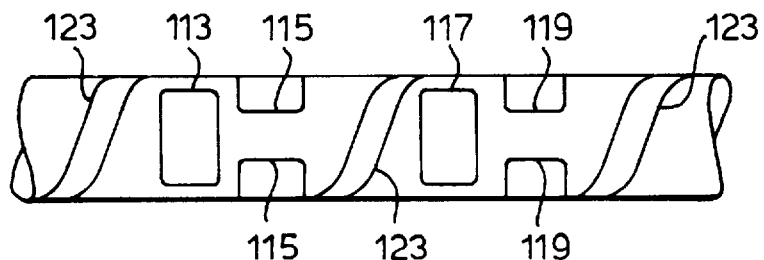
FIGS. 8 and 9 illustrate a third alternative form for the coil arrangement.
Figure 9:
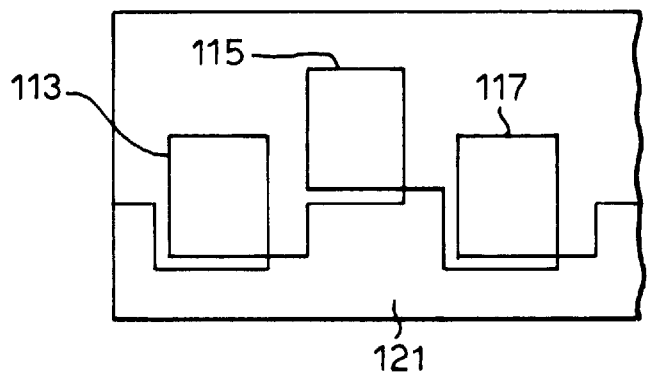
Figure 10:
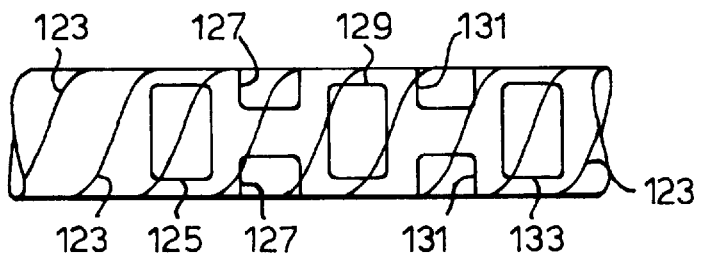
FIG. 10 illustrates a fourth alternative form for the coil arrangement.

As illustrated in FIG. 8, to provide a three-axis system, saddle coil arrangements suitably also include a spiral coil 123 wound axially around the object 25. The spiral coil 123 may be wound in gaps between axially spaced pairs of saddle coils 113, 115 and 117, 119, as shown in FIG. 8, or alternatively over unspaced pairs of saddle coils 125, 127, 129, 131 and 133 as shown in FIG. 10. The spiral coil 123 is suitably carried on a flexible substrate (not shown) separate from the substrate carrying the saddle coils 113, 115, 117, 119 or 125, 127, 129, 131, 133.

In a still further embodiment (not shown) of the coil arrangement 27, which is intended to provide a constant sensitivity, there are three layers of windings each of which provides a generally planar coil. One coil lies substantially in a first plane at 54° to the axis of the object 25 when it is straight, a second coil lies substantially in a plane orthogonal to the first plane, and the third coil lies substantially in a plane normal to the axis of the object 25 when it is straight. The angle of 54° to the axis of the object 25 is chosen since this is the angle which the diagonal of a cube makes with the edges of the cube.

It will be appreciated that, in general, the efficiency of the coil arrangement 27 increases as the number of windings, and hence the number of layers of windings, in the coil arrangement 27 increases. However, the fact that the thickness of the coil arrangement 27 increases as the number of layers of windings increases can present a problem.

We claim:

1. A method of locating the position of an object placed in a region of a body being examined using a magnetic resonance technique comprising: attaching to the object a closed loop tuned coil arrangement; subjecting said region to a magnetic resonance excitation and detection examination sequence at the frequency to which said coil arrangement is tuned, so as to acquire a detected signal, the sequence including at least one magnetic field gradient whereby the detected signals are spatially encoded; and utilizing the detected signals to obtain an indication of the position of said coil arrangement and hence said object, in said region; the coil arrangement being carried on a tubular flexible former and incorporating turns which lie substantially in non-parallel planes when the axis of the former lies substantially in a straight line.

2. A method according to claim 1 wherein the coil arrangement includes at least one turn which lies substantially in a plane orthogonal to the plane of at least one other turn of the coil arrangement when the axis of the former lies substantially in a straight line.

3. A method according to claim 2 wherein the coil arrangement comprises two separate tuned coils whose turns substantially lie respectively in substantially orthogonal planes.

4. A method according to claim 1 wherein the coil arrangement includes at least one turn whose axis lies substantially in a first plane including the axis of the object and at least one other turn whose axis lies substantially in another plane containing the axis of the object.

5. A method according to claim 1 wherein said turns are of saddle form.

6. A method according to claim 5 wherein the coil arrangement comprises pairs of turns of saddle form at diametrically opposite axially aligned positions on the object with different pairs aligned on orthogonal axes.

7. A method according to claim 6 wherein the coil arrangement further includes a spiral coil wound on the object coaxial therewith.

8. A method according to claim 1 wherein the coil arrangement comprises one or more electrically conductive tracks carried on one or more thin flexible substrates wrapped around the object.

9. A method according to claim 8 wherein the coil arrangement comprises at least one turn which lies substantially in a first plane at an angle of substantially 54° to the axis of the object when it is straight, at least one turn which lies substantially in a second plane which is orthogonal to the first plane, and at least one turn which lies substantially in a third plane normal to the axis of the object.

10. A magnetic resonance apparatus for the examination of an internal region of a body including means for indicating the location of an object placed in said region comprising: a closed loop tuned coil arrangement attached to the object; and means for subjecting said region to a magnetic resonance excitation and detection examination sequence at the frequency to which the coil arrangement is tuned so as to acquire a detected signal, the sequence including the application of at least one spatially encoding magnetic field gradient to said region to enable determination of the position of the coil, and hence the object, in the body from the detected signal, and the coil arrangement being carried on a tubular flexible former and incorporating turns which lie substantially in non-parallel planes when the axis of the former lies substantially in a straight line.

11. An apparatus according to claim 10 wherein the coil arrangement includes at least one turn which lies substantially in a plane orthogonal to the plane of at least one other turn of the coil arrangement when the axis of the former lies substantially in a straight line.

12. An apparatus according to claim 11 wherein the coil arrangement comprises two separate tuned coils whose turns substantially lie respectively in substantially orthogonal planes.

13. An apparatus according to claim 10 wherein the coil arrangement includes at least one turn whose axis lies substantially in a first plane including the axis of the object and at least one other turn whose axis lies substantially in another plane containing the axis of the object.

14. An apparatus according to claim 10 wherein said turns are of saddle form.

15. An apparatus according to claim 14 wherein the coil arrangement comprises pairs of turns of saddle form at diametrically opposite axially aligned positions on the object with different pairs aligned on orthogonal axes.

16. An apparatus according to claim 15 wherein the coil arrangement further includes a spiral coil wound on the object coaxial therewith.

17. An apparatus according to claim 10 wherein the coil arrangement comprises one or more electrically conductive tracks carried on one or more thin flexible substrates wrapped around the object.

18. An apparatus according to claim 17 wherein the coil arrangement comprises at least one turn which lies substantially in a first plane at an angle of substantially 54° to the axis of the object when it is straight, at least one turn which lies substantially in a second plane which is orthogonal to the first plane, and at least one turn which lies substantially in a third plane normal to the axis of the object.

* * * * *